United States Patent [19]

Shibano et al.

[11] Patent Number: 4,990,393
[45] Date of Patent: Feb. 5, 1991

[54] PRINTED CIRCUIT BOARD

[75] Inventors: Norihiko Shibano; Yasuyuki Yamada, both of Saitama, Japan

[73] Assignee: Pioneer Electronic Corporation, Tokyo, Japan

[21] Appl. No.: 382,928

[22] Filed: Jul. 20, 1989

[30] Foreign Application Priority Data

Dec. 23, 1988 [JP] Japan .................. 63-165831[U]

[51] Int. Cl.⁵ .............................................. B32B 9/00
[52] U.S. Cl. ................................... 428/209; 428/411.1; 428/913; 428/901; 174/35 R; 361/397
[58] Field of Search ................. 174/35 R; 361/397; 430/311; 428/209, 411.1, 901, 913

[56] References Cited

U.S. PATENT DOCUMENTS

| | | | |
|---|---|---|---|
| 2,948,834 | 8/1960 | Kalfaian | 174/35 R |
| 3,469,017 | 9/1969 | Starger | 174/35 R |
| 3,705,332 | 12/1972 | Parks | 174/35 R |
| 4,339,628 | 7/1982 | Marcantonio et al. | 174/35 R |
| 4,388,132 | 6/1983 | Hoge et al. | 174/35 R |
| 4,658,334 | 4/1987 | McSparran et al. | 174/35 R |

FOREIGN PATENT DOCUMENTS 3133441 3/1983 Fed. Rep. of Germany .

Primary Examiner—Patrick J. Ryan
Attorney, Agent, or Firm—Sughrue, Mion, Zinn, Macpeak & Seas

[57] ABSTRACT

A printed circuit board has the printed circuit shielded against radiation of high frequency signals by upper and lower conductive plates separated from the printed circuit and substrate by resist layer.

4 Claims, 1 Drawing Sheet

PRINTED CIRCUIT BOARD

BACKGROUND OF THE INVENTION

The present invention relates to a printed circuit board (hereafter referred to as PCB), in which a High frequency circuit, a reference signal generating circuit or the like formed on the PCB is shielded in order to prevent the radiant noise generated from the copper printed circuits carrying h.f. signals from adversely influencing the rest of the system.

The conventional shielded PCB is shown in FIG. 3. In FIG. 3, electric parts 1 are soldered to a PCB 2 at a predetermined point so that a noise generating circuit portion 3, such as a high frequency circuit and a reference signal generating circuit, is formed on PCB. In which, the noise is radiated from circuit elements, copper patterns or the like.

In such PCB, thin slots 4 are provided around the noise generating circuit portion 3 to receive pawls 5a of a shield case 5 made from metal. Thereafter, a shield case 6 is placed on the back of the PCB 2, and the shield cases 5 and 6 are connected by soldering or the like.

The conventional shield for the PCB covers the electric parts 1 of the noise generating circuit portion 3, so that the volume of the shield case becomes large. Therefore, it is difficult to provide high density PCB products using such conventional arrangements.

Further, air flow is interrupted or prevented by the shield cases 5 and 6, so that the heat generated from the electric parts 1 remains in the shield cases 5 and 6. Therefore, the temperature characteristic of the elements cause them to be adversely affected.

Furthermore, the manufacturing cost becomes large by the cost of the die of the shield cases, parts or the assembling.

SUMMARY OF THE INVENTION

An object of the present invention is to solve the above-mentioned disadvantages of the conventional shielded PCB and provide a shielded PCB which can be made with high density and low cost.

These objects are provided in the present invention by forming a resist layer on at least a portion of the PCB which is required to be the shielded by a conductive box. Thereafter, a conductive layer is formed on the resist layer, and another resist layer is formed on the conductive layer to cover the under layers. A resist layer and a conductive layer are also formed on the back side.

DESCRIPTION OF PREFERRED EMBODIMENT

An embodiment of the present invention will be described with reference to FIGS. 1 and 2.

Figure 1:
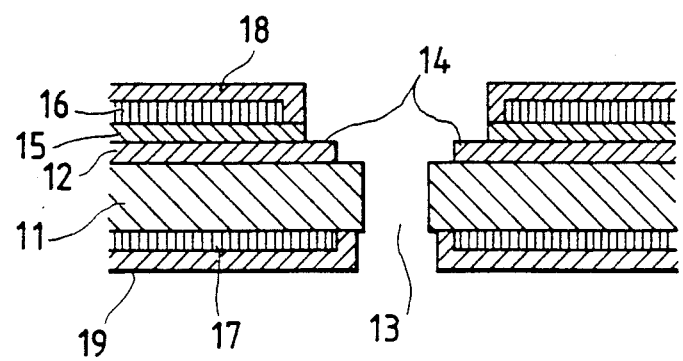
FIG. 1 is a sectional view showing a part of an embodiment according to the present invention.
Figure 2:
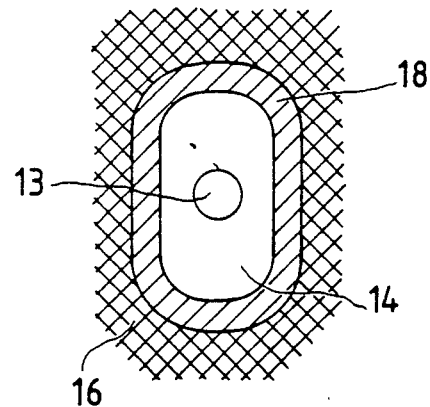
FIG. 2 is plane view of the embodiment.
Figure 3:
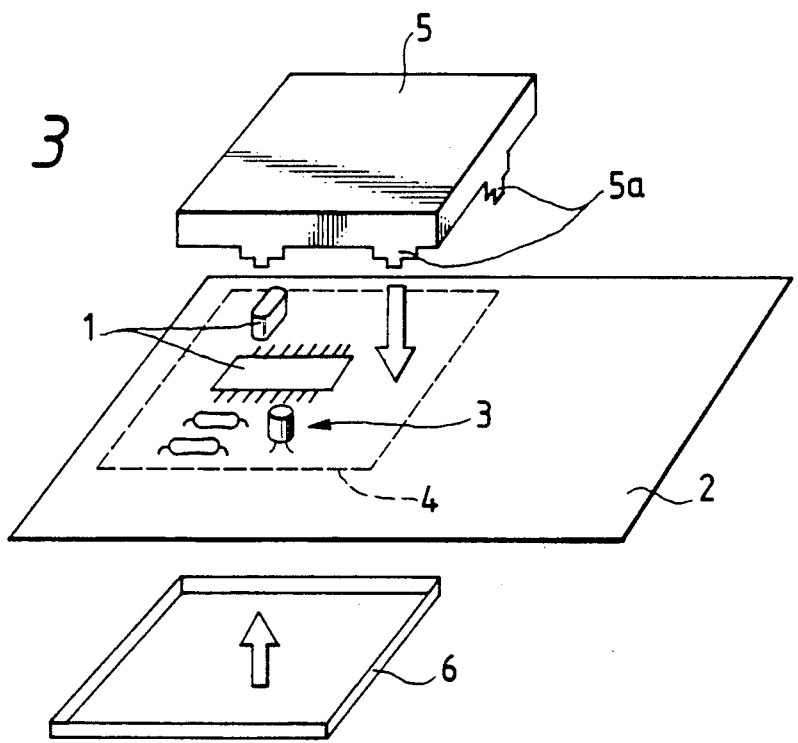
FIG. 3 is a view of a conventional shielded PCB.

In FIG. 1, a numeral 11 designates a substrate formed from a material such as paper-phenol or glass-epoxy, and a predetermined circuit pattern is printed on the surface thereof by a copper foil 12. To insulate the copper foil 12, a resist or insulating layer 15 is printed therein, except for a land portion 14 which surrounds a hole 13 into which inserted the terminals of electric parts to be soldered thereto.

Further, in the portion of the PCB where there will exist a radiated noise from a high frequency circuit or a reference signal generating circuit, conductive thin films 16 and 17, such as a copper foil or the like, are formed on the surface of the above-mentioned resist layer 15 and a back side of the substrate 11, respectively, by printing of conductive material. The conductive thin films 16 and 17 are grounded.

Further, the resist or insulating layers 18 and 19 are formed on the conductive thin film 16 and 17, respectively, to insulate the films 16 and 17 from the electric element soldered to the copper printed circuit 12 in the land areas.

The soldering of the electric parts is performed conventionally, but the radiant noise generated from the circuit pattern of the copper foil 12 is shielded by the conductive thin films 16 and 17 so that it is possible to prevent the noise from influencing the circuitry. In this case, the noise generated from land portion is only a little in comparison with the noise generated from the circuit pattern.

However, when the radiant noise is generated from the electric circuit elements of the radiant noise generating circuit, the shield case 5 may be used over only the electric elements. In this case, the back side of the substrate 11 is shielded by the conductive thin film 17 so that the shield case 6 of the back side, as conventionally used, is not necessary.

In the above-described embodiment the conductive thin film 16 and 17 are formed at only the noise generating portion, but the thin film portion can be extended to all the surface of the substrate 11 so as to shield the circuit receiving the radiant noise.

Further, the embodiment described above is for a single side PCB, but the invention is not limited thereto. The present invention may also be used with a double sided PCB or a multi-layered PCB by forming the conductive thin films together with the resist layer.

As described above, the PCB according to the present invention need not include a shielding case on both sides,.nor will the shielding case on the top side be as large as in the conventional PCB, so that it is possible to make the product with high density, and to prevent the heat from being trapped on the PCB. Therefore, the product can be made compact, and the temperature characteristic can be improved.

What is claimed is:

1. In printed circuit board of the type having a substrate, an electrically conductive printed circuit at least on the top surface of said substrate, a plurality of holes in said board and lands of said printed circuit for soldering circuit elements thereto; the improvement comprising, a conductive layer overlying said substrate and printed circuit, but not covering said land areas, and insulated from said printed circuit by insulation material, and a conductive layer on the bottom surface of said substrate.

2. In a printed circuit board as claimed in claim 1, wherein said insulation consists of an insulating layer between said conductive layer and said printed circuit substrate and an insulating layer overlying said conductive layer.

3. In a printed circuit board as claimed in claim 2, further comprising an insulating layer covering said bottom conductive layer.

4. In a printed circuit board as claimed in claim 3, further comprising circuit elements soldered to said land area and a shield case covering only said circuit elements.

* * * * *